US012726206B2

(12) United States Patent
Reber et al.

(10) Patent No.: US 12,726,206 B2
(45) Date of Patent: Sep. 1, 2026

(54) ELECTRO-OPTIC FREQUENCY COMB GENERATION WITH HARMONIC RF MODULATION

(71) Applicant: University of Georgia Research Foundation, Inc., Athens, GA (US)

(72) Inventors: Melanie Ann Roberts Reber, Athens, GA (US); Todd Eliason, Athens, GA (US)

(73) Assignee: UNIVERSITY OF GEORGIA RESEARCH FOUNDATION, INC, Athens, GA (US)

( * ) Notice: Subject to any disclaimer, the term of this patent is extended or adjusted under 35 U.S.C. 154(b) by 240 days.

(21) Appl. No.: 18/749,339

(22) Filed: Jun. 20, 2024

(65) Prior Publication Data

US 2024/0429925 A1 Dec. 26, 2024

Related U.S. Application Data

(60) Provisional application No. 63/521,967, filed on Jun. 20, 2023.

(51) Int. Cl.
*H03L 7/093* (2006.01)

(52) U.S. Cl.
CPC .................................... *H03L 7/093* (2013.01)

(58) Field of Classification Search
CPC ....... H03L 7/093; H03L 7/23; G02F 2203/50; G02F 2203/56
USPC .......................................................... 359/279
See application file for complete search history.

(56) References Cited

U.S. PATENT DOCUMENTS

| | | | | |
|---|---|---|---|---|
| 10,048,567 B2 * | 8/2018 | Papp | G02F 1/3501 |
| 10,585,332 B2 * | 3/2020 | Plascak | H01S 3/1307 |
| 10,942,417 B2 * | 3/2021 | Plascak | H01S 3/1003 |
| 2004/0051936 A1 * | 3/2004 | Watson | H03B 21/02 359/326 |
| 2017/0277017 A1 * | 9/2017 | Papp | G02F 1/365 |
| 2019/0278155 A1 * | 9/2019 | Plascak | G02F 1/353 |
| 2020/0192185 A1 * | 6/2020 | Plascak | H01S 3/1003 |
| 2020/0328573 A1 * | 10/2020 | Prather | H01S 5/068 |

OTHER PUBLICATIONS

Xu B, Fan X, Wang S, He Z. Wideband and high-resolution spectroscopy based on an ultra-fine electro-optic frequency comb with seed lightwave selection via injection locking. Opt Lett. Apr. 15, 2021;46(8):1876-1879. doi: 10.1364/OL.420377. PMID: 33857093.

Van Howe J, Hansryd J, Xu C. Multiwavelength pulse generator using time-lens compression. Opt Lett. Jul. 1, 2004;29 (13):1470-2. doi: 10.1364/ol.29.001470. PMID: 15259716.

(Continued)

*Primary Examiner* — William R Alexander

(74) *Attorney, Agent, or Firm* — Thomas | Horstemeyer, LLP

(57) ABSTRACT

The present disclosure is directed to an electro-optic frequency comb having a plurality of cascaded electro-optic modulators driven at sequential lower harmonics, wherein the last megahertz modulation dictating the repetition rate. This architecture can modulate at any individual harmonic and repetition rate without changes to the components. This comb can be used in any applications where a stable and tunable repetition rate is needed.

20 Claims, 8 Drawing Sheets

(56) References Cited

OTHER PUBLICATIONS

B. Buscaino, M. Zhang, M. Lonar and J. M. Kahn, "Design of Efficient Resonator-Enhanced Electro-Optic Frequency Comb Generators," in Journal of Lightwave Technology, vol. 38, No. 6, pp. 1400-1413, Mar. 15, 15, 2020, doi: 10.1109/JLT.2020.2973884. keywords: {Optical resonators; Generators; Resonant frequency; Frequency modulation; Optical modulation; Optical coupling; Electro-optic modulation; integrated optics; optical communications; optical frequency combs}.

Zheng Gong, Mohan Shen, Juanjuan Lu, Joshua B. Surya, and Hong X. Tang, "Monolithic Kerr and electro-optic hybrid microcombs," Optica 9, 1060-1065 (2022).

Li J, Yi X, Lee H, Diddams SA, Vahala KJ. Electro-optical frequency division and stable microwave synthesis. Science. Jul. 18, 2014;345(6194):309-13. doi: 10.1126/science.1252909. Epub Jun. 19, 2014. PMID: 25035489.

Li C, Zhang H, Zhou G, Lu L, Jin M, Dong J, Zhou L, Chen J. Hybrid WDM-MDM transmitter with an integrated Si modulator array and a micro-resonator comb source. Opt Express. Nov. 22, 2021;29(24):39847-39858. doi: 10.1364/OE.444493. PMID: 34809340.

Deakin C, Zhou Z, Liu Z. Phase noise of electro-optic dual frequency combs. Opt Lett. Mar. 15, 2021;46(6):1345-1348. doi: 10.1364/OL.418543. PMID: 33720183.

* cited by examiner a)
Power (dBm)
-20
-40
-60
-80
11.40
11.42
11.44
11.46
11.48
Frequency (GHz)

b)
Power (dBm)
-20
-40
-60
-80
1036
1038
1040
1042
1044
Frequency (MHz)
c)
Power (dBm)
-20
-40
-60
-80
76
78
80
82
84
Frequency (MHz)

d)
Phase Noise (dBc/Hz)
-40
-80
-120
Instrument
80 MHz
1.04 GHz
11.44 GHz
$10^2$
$10^3$
$10^4$
$10^5$
$10^6$
Offset Frequency (Hz)

FIG. 5A a)

Figures 5A, 5B:
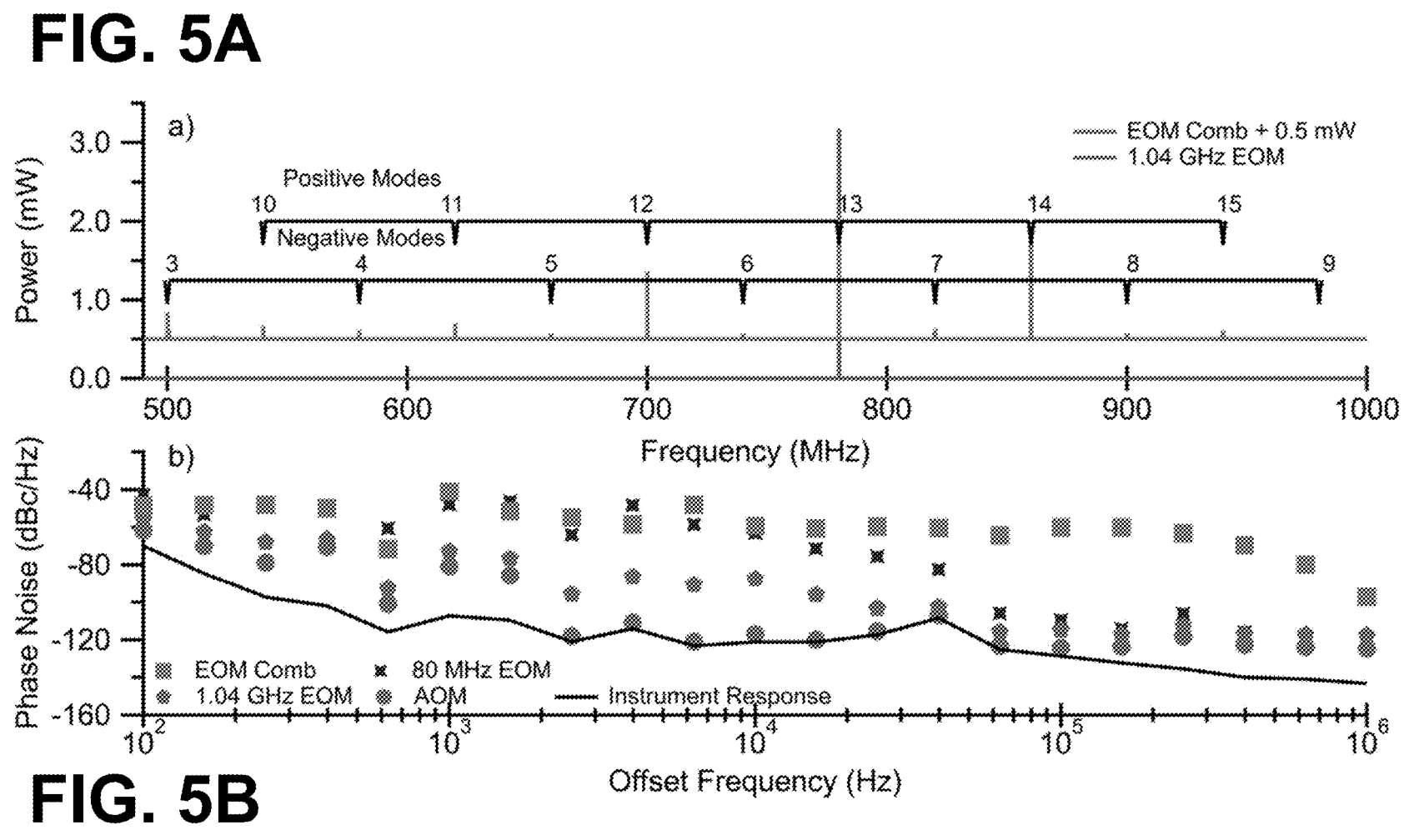

Power (mW)

3.0
2.0
1.0
0.0

EOM Comb + 0.5 mW
1.04 GHz EOM

Positive Modes
Negative Modes 3 10 4 11 5 12 6 13 7 14 8 15 9

500 600 700 800 900 1000

Frequency (MHz)

FIG. 5B b)

Phase Noise (dBc/Hz)

-40
-80
-120
-160

EOM Comb
1.04 GHz EOM
80 MHz EOM
AOM
Instrument Response $10^2$ $10^3$ $10^4$ $10^5$ $10^6$ Offset Frequency (Hz)

a)
Response (V)
0.00
0.10
0.20
0.30
-60
-40
-20
0
20
40
60
Detuning Frequency (GHz)

b)
Response (V)
0.0
0.1
0.2
0.3
0.4
0.5
0.6
-6
-4
-2
0
2
4
6
Detuning Frequency (GHz)

c)
Response (logV)
0.001
0.01
0.1
1
-80
-60
-40
-20
0
20
40
60
Detuning Frequency (GHz)

a)
1.04 GHz Harmonic
-13 -12 -11 -10 -9 -8 -7 -6 -5 -4
Intesnsity (a.u)
-12.48 -10.40 -8.32 -6.24 -4.16
Detuning Frequency (GHz)

b)
1.2(-11.44) GHz Modes
-1 0 1 2 3 4 5
1.2 GHz Modes
-7 -6 -5 -4 -3
Intensity (a.u.)
-12.48 -10.40 -8.32 -6.24 -4.16
Detuning Frequency (GHz)

c)
Intensity (a.u.)
11.44 and 1.04 GHz Modulation
11.44 and 1.2 GHz Modulation
11.44 GHz Modulation
-12.48 -10.40 -8.32 -6.24 -4.16
Frequency (GHz)

ELECTRO-OPTIC FREQUENCY COMB GENERATION WITH HARMONIC RF MODULATION

CROSS-REFERENCE TO RELATED APPLICATION

This application claims priority to, and the benefit of, U.S. Provisional Patent Application 63/521,967 entitled "ELECTRO-OPTIC FREQUENCY COMB GENERATION WITH HARMONIC RF MODULATION" which was filed on Jun. 20, 2023, and is incorporated by reference as if set forth herein in its entirety.

BACKGROUND

Electro-optic frequency combs have highly stable frequency modes which are used in telecom and spectroscopic applications. These combs are generated by modulating non-linear electro-optic crystals with radio frequencies, which creates equally spaced sidebands centered around the continuous-wave (CW) seed laser. Electro-optic frequency comb architectures often choose between optical bandwidth (cascaded gigahertz (GHz) combs) or higher mode density (chirped radiofrequency (RF) generation).

SUMMARY

In accordance with the purpose(s) of this disclosure, as embodied and broadly described herein, the disclosure, in various aspects, relates to an electro-optic frequency comb which is generated with harmonic radiofrequency (RF) modulation. The solutions described herein use principles of physics, chemistry, and electrical engineering to arrive at a novel solution for generation of an electro-optic frequency comb which produces a stable and tunable repetition rate.

Aspects of the present disclosure provide for an electro-optic frequency comb with >120 gigahertz (GHz) of bandwidth and a megahertz repetition rate and methods of generating the same. This comb has three cascaded electro-optic modulators driven at sequential lower harmonics, with the last megahertz modulation dictating the repetition rate. This architecture can modulate at any individual harmonic and repetition rate without changes to the components. This comb can be used in any application where a stable and tunable repetition rate is needed. Embodiments of the present disclosure include: an electro-optic frequency comb, comprising a seed laser directed through a series of phase modulating EOMs. The series of phase modulating EOMS can each contain the following components: a first phase-locked loop (PLL) connected in series with a first electro-optic modulator (EOM), a second PLL connected in series with a second EOM, where the second PLL and the first PLL connected in parallel, and a third PLL connected in series with a third EOM, the third PLL connected in parallel with the second PLL and the first PLL. In some embodiments, the seed laser is matched to a reference frequency. Each of the first PLL, the second PLL, and the third PLL can be connected in series with a respective phase shifter disposed between the reference frequency and the corresponding PLL. In some examples, the reference frequency is generated by a 10 MHz rubidium clock. In some examples, the seed laser comprises a narrow linewidth laser having a linewidth of less than 1 megahertz (MHz).

According to various embodiments, the first EOM has a higher harmonic frequency than the second EOM, and the second EOM has a higher harmonic frequency than the third EOM. For example, in some embodiments, the first EOM comprises an 11-12.5 gigahertz (GHz) EOM, the second EOM comprises a 1-2 GHz EOM, and the third EOM comprises a 75-150 megahertz (MHZ) EOM. Each of the first PLL, the second PLL, and the third PLL can be connected in series with a respective radiofrequency (RF) Amplifier disposed between the VCO and the EOM. Each of the first PLL, the second PLL, and the third PLL can include the following components: a phase detector, a loop filter connected in series with the phase detector, a tunable frequency source connected in series with the loop filter, and a frequency divider connected in parallel with the loop filter and the tunable frequency source. The frequency divider can be selected based at least in part on the reference frequency.

Additionally, an electro-optic modulator (EOM) system is provided, comprising a reference frequency source, a seed laser; and a plurality of phase modulators connected in parallel to the reference frequency source. Each phase modulator can include at least a phase shifter connected to the reference frequency source, a phase-locked loop (PLL) connected in series with the phase shifter, and a radiofrequency amplifier connected in series with the PLL. In addition, the EOM system includes a plurality of cascading EOMs connected to the seed laser in series, where each EOM of the plurality of cascading EOMs is connected to a respective phase modulator. Each EOM of the plurality of cascading EOMs can have a sequentially lower harmonic frequency. Additionally, each EOM of the plurality of cascading EOMs can be driven by a respective PLL.

Each PLL can comprise a phase detector, a loop filter connected in series with the phase detector, a voltage controlled oscillator (VCO) connected in series with the loop filter, and a frequency divider connected in parallel with the loop filter and the VCO. The frequency divider can be selected based at least in part on the reference frequency source. In some examples, the reference frequency source comprises a rubidium clock. In some embodiments, the seed laser comprises a narrow linewidth laser having a linewidth of less than 1 megahertz (MHz).

Also provided herein is a method of generating an electro-optic frequency comb (EOM comb). The steps of the method include directing a seed laser through a series of cascading electro-optic modulators (EOMs), driving each EOM of the series of cascading EOMs with a respective phase-locked loop (PLL), where each EOM having a sequentially lower harmonic frequency, and stabilizing each of the PLLs with a reference frequency. Driving each EOM of the series of cascading EOMs with a respective PLL can further include the steps of controlling a relative phase between the reference frequency and the PLL with a respective phase shifter, and generating a phase stable single frequency with the respective PLL. Each PLL includes a phase detector, a loop filter connected in series with the phase detector, a voltage controlled oscillator (VCO) connected in series with the loop filter, and a frequency divider connected in parallel with the loop filter and the VCO.

Other systems, methods, devices, features, and advantages of the devices and methods will be or become apparent to one with skill in the art upon examination of the following drawings and detailed description. It is intended that all such additional systems, methods, devices, features, and advantages be included within this description, be within the scope of the present disclosure, and be protected by the accompanying claims.

BRIEF DESCRIPTION OF THE DRAWINGS

Further aspects of the present disclosure will be more readily appreciated upon review of the detailed description of its various embodiments, described below, when taken in conjunction with the accompanying drawings. The components in the drawings are not necessarily to scale, emphasis instead being placed upon clearly illustrating the principles of the present disclosure. Moreover, in the drawings, like reference numerals designate corresponding parts throughout the several views.

FIGS. 5A-5B shows example RF Spectra according to various embodiments of the present disclosure. FIG. 5A shows the selection of the RF Spectrum from 490-1000 MHZ, where the EOM comb signal is shifted up by 0.5 mW. The racetracks denote the comb tooth number from the seed laser for the positive and negative sides of the EOM comb. FIG. 5B shows the phase noise of the Instrument, AOM, Single Modulation at 1.04 GHZ and 80 MHZ, and the phase noise of the comb teeth.

FIG. 6A shows the seed laser modulated at 11.44 GHz. FIG. 6B shows the seed laser modulated by 1.04 GHz. FIG. 6C shows the spectrum collected of the full EOM comb, averaged 3 times.

FIG. 8A shows a trace of 11.44 and 1.04 GHZ modulation. The harmonic numbers are measured from the seed laser which is set to 0 GHz. FIG. 8B shows a trace of the 11.44 and 1.2 GHz modulation. The bottom racetrack is counting 1.2 GHz modes starting at the seed laser. The top racetrack is counting modes generated from the −11.44 GHz mode. FIG. 8C shows a trace of the seed laser modulated with attenuated 11.44 GHz source.

DETAILED DESCRIPTION

Figure 1:
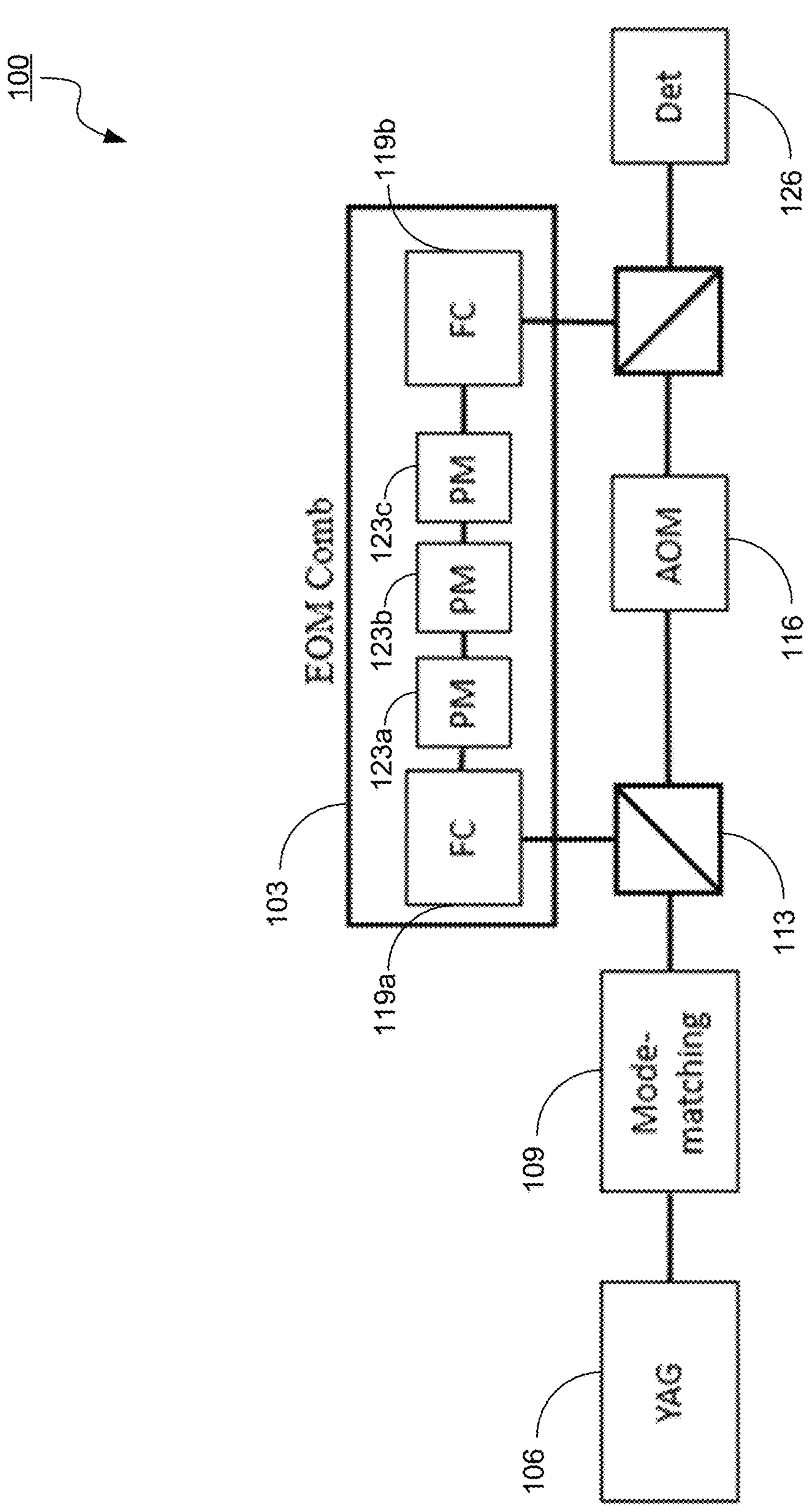
FIG. 1 is a drawing of an example optical scheme for an electro-optic modulator (EOM) comb according to various embodiments of the present disclosure.

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, principles of physics, chemistry, and electrical engineering techniques and the like, which are within the skill of the art. Such techniques are explained fully in the literature.

The following examples are put forth to provide those of ordinary skill in the art with a complete disclosure and description of how to perform the methods and use the compositions and compounds disclosed and claimed herein. Efforts have been made to ensure accuracy with respect to numbers (e.g., amounts, measurements, etc.), but some errors and deviations should be accounted for.

Before the embodiments of the present disclosure are described in detail, it is to be understood that, unless otherwise indicated, the present disclosure is not limited to particular materials, machines, computing processes, or the like, as such can vary. It is also to be understood that the terminology used herein is for purposes of describing particular embodiments only and is not intended to be limiting. It is also possible in the present disclosure that steps can be executed in different sequence where this is logically possible.

All publications and patents cited in this specification are cited to disclose and describe the methods and/or materials in connection with which the publications are cited. Publications and patents that are incorporated by reference, where noted, are incorporated by reference as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant application should not be treated as such and should not be read as defining any terms appearing in the accompanying claims. Any terms not specifically defined within the instant application, including terms of art, are interpreted as would be understood by one of ordinary skill in the relevant art; thus, is not intended for any such terms to be defined by a lexicographical definition in any cited art, whether or not incorporated by reference herein, including but not limited to, published patents and patent applications. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

It should be noted that ratios, amounts, and other numerical data can be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to about 5%" should be interpreted to include not only the explicitly recited values of about 0.1% to about 5%, but also include individual values (e.g., 1%, 2%, 3%, and 4%) and the sub-ranges (e.g., 0.5%, 1.1%, 2.2%, 3.3%, and 4.4%) within the indicated range. Where the stated range includes one or both of the limits, ranges excluding either or both of those included limits are also included in the disclosure, e.g., the phrase "x to y" includes the range from 'x' to 'y' as well as the range greater than 'x' and less than 'y'. The range can also be expressed as an upper limit, e.g., 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In some embodiments, the term "about" can include traditional rounding according to significant figures of the numerical value. In addition, the phrase "about 'x' to 'y'", where 'x' and 'y' are numerical values, includes "about 'x' to about 'y'".

Discussion

Disclosed are various approaches for an electro-optic frequency comb which is generated with harmonic radiofrequency (RF) modulation. Frequency combs, or combs, are stable lasers comprised of many individual frequency modes. Unlike other broadband lasers, combs require the repetition rate (frequency mode spacing) and carrier-envelope offset (phase offset) to be stabilized. Frequency combs were first developed for frequency metrology because they can measure optical frequencies in the RF. Many different methods can be used to generate frequency combs, with mode-locked lasers being the most common.

Electro-optic frequency combs (EOM combs) are frequency combs generated using electro-optic modulators (EOMs) often with a continuous wave (CW) seed laser. EOM-combs have many advantages over the traditional mode-locked laser approach, including that the comb parameters can be controlled through simple electronics rather than nonlinear optics. Additionally, EOM Combs can be used to perform many different kinds of spectroscopy: absorbtion spectroscopy, dual comb spectroscopy, photoacoustic spectroscopy, photothermal spectroscopy and more. EOM Combs also offer advantages in arbitrary waveform generation, ranging, optical communications, astronomical spectrum correction, and spectrum detection, due to their highly stable repetition rates. The frequency of the modulation dictates the repetition rate (mode spacing), thus creating the equally spaced frequency modes.

There are many different architectures that can be used to generate an EOM comb, both in the optical and the electronic set-ups. Optically, the EOM's can be in the laser cavity or external to the laser cavity. The first type of EOM combs were intracavity EOM Combs. This method only requires a single EOM in a cavity, either having separate mirrors or polishing the EOM crystal. One of the first examples is from Bell Laboratories in 1963, which used a single modulator in a Fabry-Perot cavity. Cavity based EOM combs typically have GHz repetition rates and the cavity can contain more elements than just the EOM. Some examples of cavity based EOM combs use Micro-resonators. Micro-resonator EOM Combs use on-chip cavities which the cavity modes create or amplify the Electro-Optic modulation.

However, EOMs do not need to be intracavity to generate a comb. Waveguide based EOM combs contain one or more EOMs in series or parallel. A single EOM based Comb has limited bandwidth, due to the RF power damage threshold of the EOM. Single EOM combs modulate with a single sine wave at GHz frequencies. The GHz repetition rate is necessary to maximize the optical bandwidth of these EOM combs. Other examples of EOM Combs use a cascaded architecture, which is two or more EOMs in series still modulating at a single frequency. Modulators in series generate a broader comb because successive modulations act on the comb teeth generated previously. Cascaded EOM combs generally have intensity modulators along with phase modulators, driven at the same RF frequency (>10 GHz typically). These combs can also be amplified and broadened to increase the optical bandwidth.

Previous EOM combs modulate at a single RF frequency, however an EOM comb can be generated without using a pure sine wave. Chirped RF generation is a method where a swept sine wave is sent to a single EOM. The repetition rate can be as low as kilohertz or even as low as 100 Hz, but these combs are usually limited to a few gigahertz in bandwidth. The current limitations of these architectures lie in the highest frequency of the function generator and the maximum RF power of the EOM. Chirped sin waves can also be used in series and in a cavity. Another method of modulating is called pseudo-random modulation (PRBS). This method uses a modified square wave to drive an EOM, which creates an EOM comb with similar limitations of chirped RF generation.

Accordingly, various embodiments of the present disclosure are directed to systems and methods for driving cascaded EOMs with sequentially lower harmonic frequencies. The present system is external to the laser cavity, thereby allowing the architecture to be applies to almost any optical wavelength region by changing the seed laser and/or EOM wavelengths. This system uses multiple EOMs in series, where each EOM is a phase modulator rather than an intensity modulator. Additionally, the present EOM comb is driven with a single frequency for each EOM, where the various frequencies are harmonics of each other. Phase-locked loops (PLLs) are used with each EOM to stabilize the phase and frequency. This method is able to take advantage of the bandwidth of the higher repetition rate, while filling in the comb with the smaller repetition rate. An early example used an EOM in a Fabry-Perot cavity, which was driven with a higher harmonic of the Fabry-Perot modes. There have also been EOM combs which contain two micro-resonators in series, first modulated at a higher frequency then modulated at a lower frequency harmonic. The second micro-resonator can be exchanged for an EOM. The initial comb modes have a higher repetition rate, then the EOM modulates at a lower frequency to reduce the final repetition rate. Two waveguide based EOM combs modulated at 12.5 GHz then 25 GHz or 5 GHz then 10 GHZ, which inverts the previous examples where the second modulation is a lower frequency. The harmonic modulation examples found do not have megahertz repetition rates unlike commercially available frequency combs.

This disclosure also introduces the use of multiple PLLs to drive the EOMs. The EOM Comb frequency sources in this work are unique to the optics field with no known examples of work using the combination of features described. For example, the use of three separate PLLs to drive each EOM of a cascaded EOM comb with a final repetition rate in the megahertz is one unique feature of the present disclosure.

In the following discussion, a general description of the system and its components is provided, followed by a discussion of the operation of the same. Although the following discussion provides illustrative examples of the operation of various components of the present disclosure, the use of the following illustrative examples does not exclude other implementations that are consistent with the principles disclosed by the following illustrative examples.

With reference to FIG. 1, shown is an example optical scheme 100 for an EOM comb 103 according to various embodiments. The optical scheme 100 for the EOM comb 103 comprises an neodymium yttrium aluminum garnet (Nd:YAG) laser 106. The Nd:YAG laser 106 is the directed through a mode-matching module 109. The mode-matching module 109 can be representative of a combination of relay optics suitable for matching the Nd:YAG laser 106 into an optical fiber. After the mode-matching module 109, the laser beam from the Nd:YAG laser 106 is split using a beam splitter 113. A portion of the beam is directed to the EOM comb 103 and a portion of the beam is directed to an acousto-optic modulator (AOM) 116. The EOM comb 103 of FIG. 1 has a fiber coupler (FC) 119*a*, 119*b* at each end, with three separate phase modulators (PMs) 123*a*, 123*b*, and 123*c* connected in series between the two fiber couplers 119*a* and 119*b*. The EOM comb 103 is described further in the discussion of FIG. 2. As shown in FIG. 1, once the laser has passed through the EOM comb 103, it is reconnected with the beam from the AOM 116 and passed to a phase detector 126.

Figure 2:
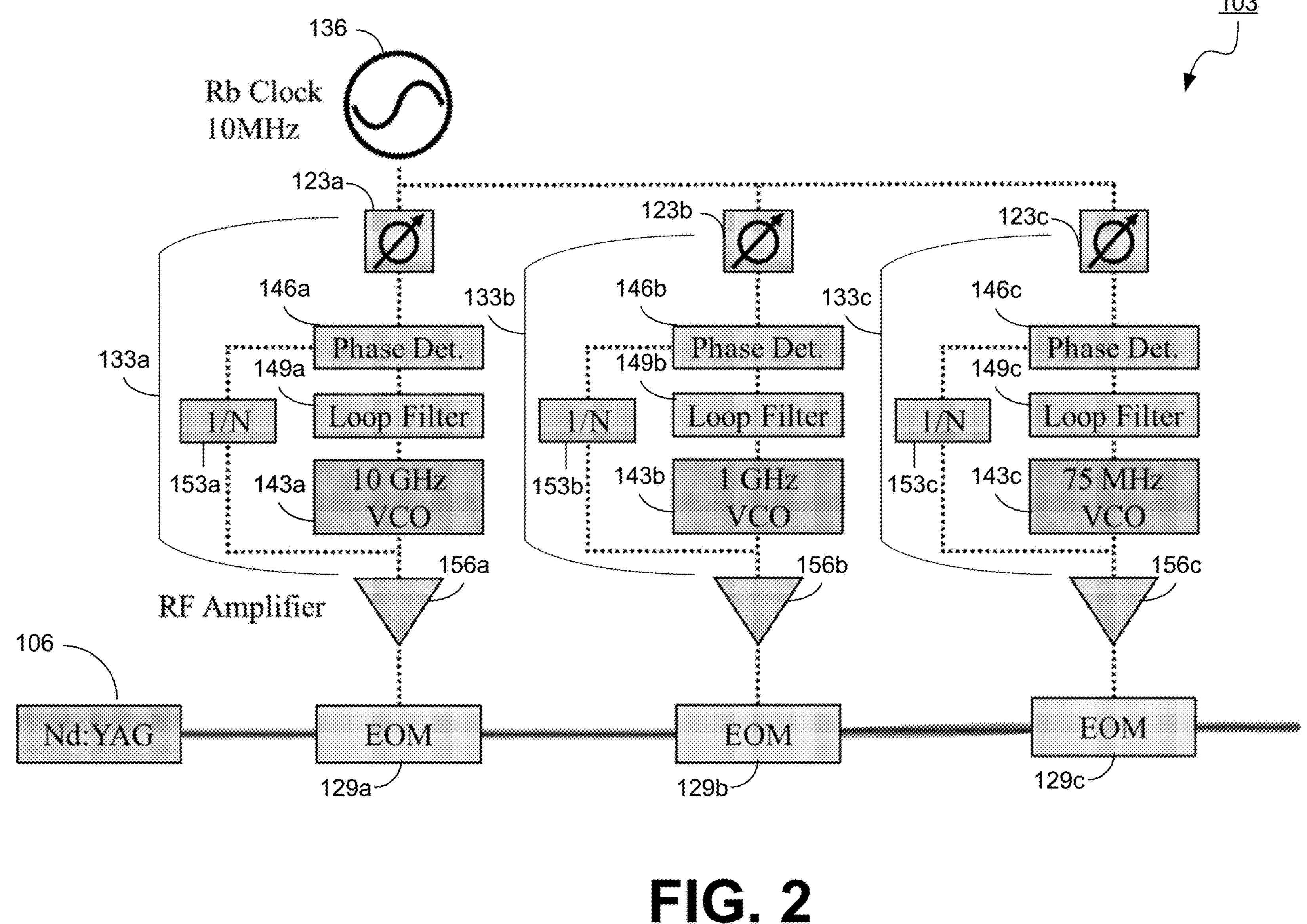
FIG. 2 is an example diagram of an EOM comb architecture according to various embodiments of the present disclosure.

Next, at FIG. 2, shown is an example of the EOM comb 103 architecture. To begin, a seed laser 106 is passed through each of the EOM units 129 to generate the EOM comb 103. The seed laser 106 is a narrow linewidth laser (e.g., ≤50 kilohertz (kHz) or in the range of approximately 1 kHz to approximately 1 MHZ, 1 kHz to 10 KHz, 10 KHz to 35 KHz, 35 kHz to 50 kHz, 50 KHz to 1 MHz, etc.). The seed laser 106 can comprise a continuous wave (CW) laser (e.g., CW diode laser, CW fiber laser, etc.) or a pulsed laser. In some examples, the seed laser 106 comprises an Nd:YAG laser have a linewidth of 3 kHz. For example, the seed laser 106 can be a Coherent Mephisto Nd:YAG, as pictured in FIG. 2.

The EOM comb 103 can have a cascaded architecture, with three phase modulators 123*a*, 123*b*, and 123 in series. The EOM comb 103 can include three separate EOMs 129*a*, 129*b*, and 129*c*. When connected in series, the EOMs 129 can be connected in a step-down order, with the first EOM 129*a* having a higher bandwidth than the second EOM 129*b*, and the second EOM 129*b* having a higher bandwidth than the third EOM 129*c*. In some examples, the three EOMs 129 can include a 11-12.5 GHZ EOM (e.g., an EOspace PM-DS5-10-PFA-PFA-106-LV) as the first EOM 129*a*. In some examples, the second EOM 129*b* can be a 1-2 GHZ EOM (e.g., IXBlue NIR-MPX-LN-10 0-10 GHZ). In some examples, the third EOM 129*c* can be a 75-150 MHZ EOM (IXBlue NIR-MPX-LN-2 0-2 GHZ). Each subsequent EOM can be driven at a lower frequency harmonic of the previous EOM. In order to stabilize the frequency and phase of the lower frequency harmonics compared to the higher frequency harmonics, phase locked loops (PLLs) 133 are used in parallel with the EOMs 129.

As shown in FIG. 2, the RF frequency sources can be three separate Phase-Locked Loops (PLLs) 133*a*, 133*b*, and 133*c*, which can be phase stabilized by using the same reference frequency 136. In the example of FIG. 2, the clock or reference frequency 136 can be a 10 MHz Rubidium (Rb) Clock (SRS SIM940). However, in other embodiments, other reference frequencies 136 may be used such as a GPS signal, another frequency comb, or any other frequency source as can be appreciated. Three phase shifters 139*a*, 139*b*, and 139*c*, can be set before the respective PLLs 133*a*, 133*b*, and 133*c*, for relative phase control between the driving frequencies. In some examples, the phase shifters 139 can be Synergy Microwave PK-721S units, or other phase shifters 139. The PLL architectures allow for phase stable single frequencies to be generated. The PLL generated frequencies can be any harmonic within the Voltage Controlled Oscillator's (VCO) 143 output range. According to various examples, each PLL 133 is comprised of a phase frequency detector (PFD) or phase detector 146, a loop filter 149, VCO 143, and a frequency divider 153. In the example of FIG. 2, the third PLL 113*c*, or the 75-150 MHz PLL in some examples, uses an evaluation board as the phase detector 146*c* and loop filter 149*c* for the VCO 143*c* (e.g., Analog ADF4152HV, Minicircuits ZOS-150+). In some examples, the second PLL 133*b*, or the 1-2 GHz PLL in some examples, can use the same evaluation board as the third PLL 133*c* with the on-board VCO 143*b*. In some examples, the first PLL 133*a*, or the 11-12.5 GHZ PLL in some examples, can use an evaluation board such as an Analog ADF41020 or similar to generate the highest frequency. PLL outputs can be amplified individually using RF amplifiers 156. In some embodiments, the RF amplifiers 156*a*, 156*b*, and 156*c* can be 11-12.5 GHZ (e.g., MiniCircuits ZVE-3W-183+), 1-2 GHZ (e.g., Minicircuits ZVA-183WX-S+), and 75-150 MHz (e.g., Minicircuits ZHL-2010+) respectively.

Figure 3:
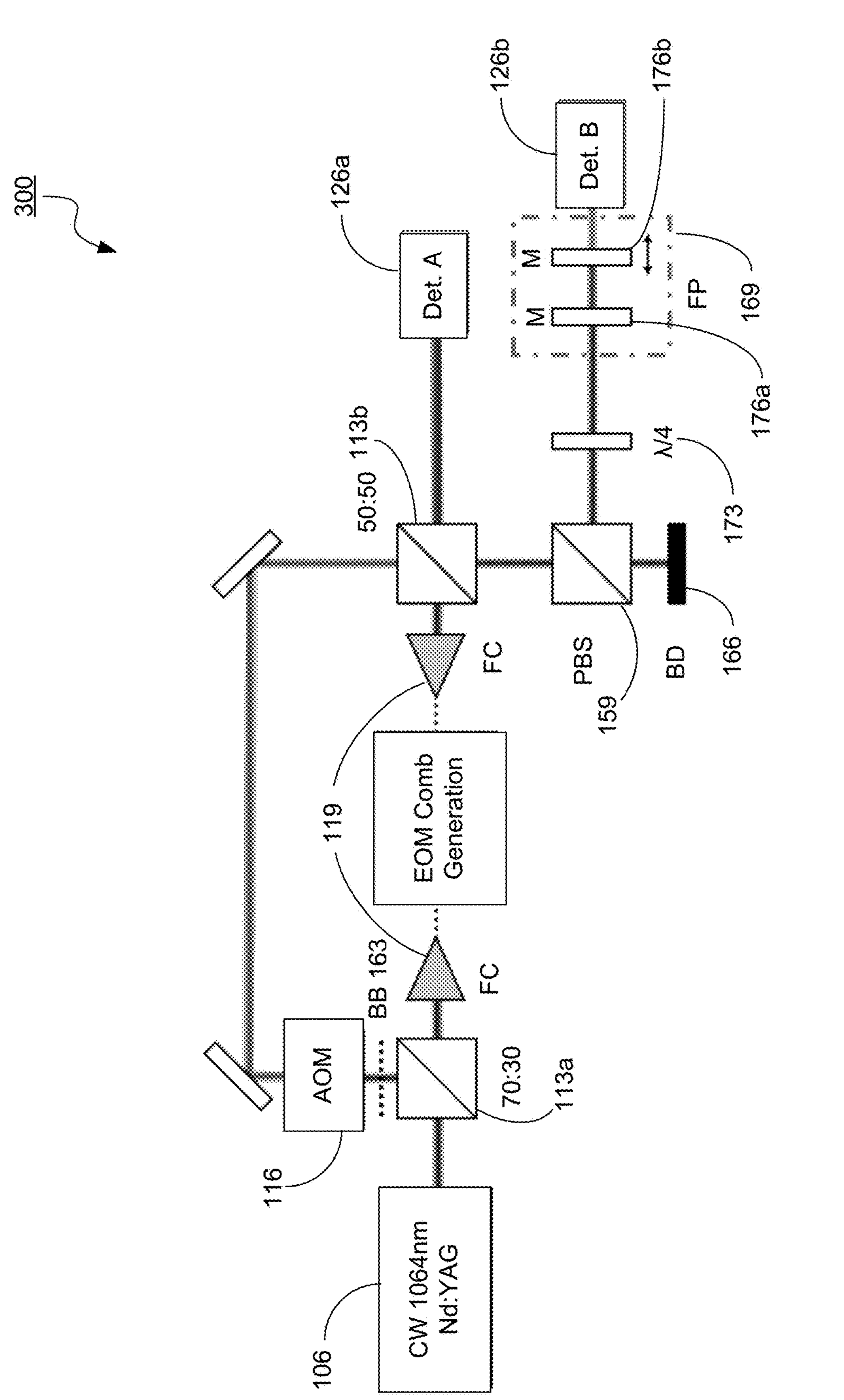
FIG. 3 is an example detection scheme according to various embodiments of the present disclosure.

Moving to FIG. 3, shown is an example of a detection scheme 300 according to various embodiments. The detection scheme 300 can be representative of a scanning Fabry-Perot configuration. As shown in FIG. 3, the detection scheme 300 can begin with a seed laser 106. In the example of FIG. 3, the seed laser 106 can comprise a CW 1064 nm Nd:YAG laser. Designations 70:30 and 50:50 are representative of beam splitters, 113*a* and 113*b* respectively, of the same respective ratio. PBS represents a polarizing beam splitter 159. BB represents a beam block 163 that is placed if the Fabry-Perot spectra are being collected. BD represents a beam dump 166. FC represents fiber couplers 119. FP represents a Fabry-Perot Cavity. Det. A., or detector 126*a*, collects the Heterodyne measurement data. Det. B., or detector 126*b*, collects the Fabry-Perot Spectra. The lines connecting the various components of the diagram represent the pathway of the laser.

To quantify higher frequency modulations and the EOM comb spectra, a scanning Fabry-Perot 169 can be used. The optical layout of the scanning Fabry-Perot detection scheme 300 is shown in FIG. 3. In at least one example, the first component is an isolator, comprised of a polarized beam splitter 159 and a quarter wave plate 173, to eliminate back reflected light. Then, two highly reflective planar mirrors 176*a*, 176*b* (e.g., R>0.9995 Edmund Optics 89-452) can be mounted with one mirror on a translation stage controlled by a stack piezo (e.g., Thorlabs PC4GR). The piezo can be controlled by a high voltage amplifier (e.g., Thorlabs MDT694B) and a function generator (e.g., Rigol DG1022Z). In some examples, the light is detected with a large mode area detector 126*b* after the second mirror (e.g., Det B: Thorlabs PDA10A2). The spectra can be collected and saved with an oscilloscope (e.g., Sigilent SDS2352X-E) or other instrument. The alignment can be adjusted with the mirror mounts and monitored through a CCD camera.

Comb frequencies are rigorously described by the carrier envelope offset and the repetition rate $$v_n = f_0 + nf_{rep}.$$

This links the optical modes to RF frequencies. To quantify the phase noise of the comb, observe the 80 MHz modulation, and observe the first mode from the 1.04 GHz modulation, the heterodyne measurement is used (see FIG. 3). The comb teeth are able to be identified due to their distinct beat frequencies, $$b_n = v_n - (v_{YAG} + f_{AOM}) = f_0 + nf_{rep} - (v_{YAG} + f_{AOM}).$$

The Nd:YAG seed laser 106 can be frequency shifted by 260 MHz using an AOM 116 and driver (e.g., Isomet M1250-T260L-Op45 and 536F-L). Using harmonic or half harmonic frequencies will cause the RF beat frequencies to be symmetric and the positive and negative modes will not be distinguishable. Accordingly, in some examples, the AOM frequency can be chosen to not be a harmonic or half harmonic of the repetition rate, to avoid overlap in frequency. As shown in FIG. 3, the frequency shifted Nd:YAG laser 106 can made co-linear with the EOM comb 103 and focused onto a first detector 126*a* (e.g., Det A: Coherent ET-3000). The resultant RF spectrum can be amplified with a low noise amplifier (e.g., LNA, Pasternack PE15A1007), and collected by an RF spectrum analyzer (e.g., Rigol DSA815). The data can be collected in small sections to increase the frequency resolution. In some examples, the phase noise data can be collected with an Advantest RF Spectrum analyzer (R3267). The phase noise floor of the instrument can be calculated using the Rb clock 136 (e.g., SRS SIM 940).

Disjunctive language such as the phrase "at least one of X, Y, or Z," unless specifically stated otherwise, is otherwise understood with the context as used in general to present that an item, term, etc., can be either X, Y, or Z, or any combination thereof (e.g., X; Y; Z; X or Y; X or Z; Y or Z; X, Y, or Z; etc.). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications can be made to the above-described embodiments without departing substantially from the spirit and principles of the disclosure. All such modifications and variations are intended to be included herein within the scope of this disclosure and protected by the following claims.

Example A

Figures 4A, 4B, 4C, 4D:
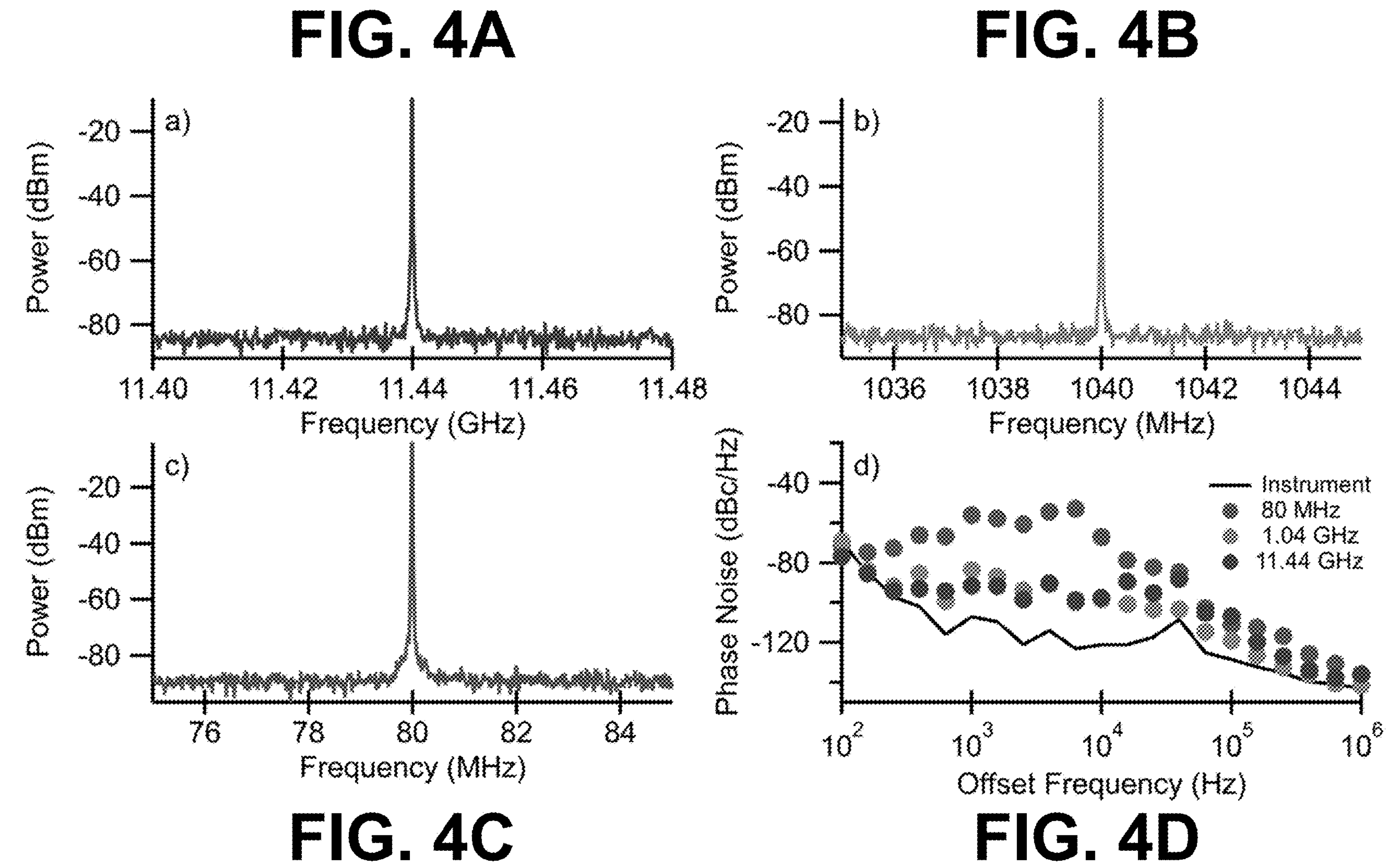
FIG. 4A shows an RF Spectra of the 11-12.5 GHZ phase-locked loop (PLL) at 11.44 GHZ, according to various embodiments of the present disclosure.
FIG. 4B shows an RF Spectra of the 1-2 GHz PLL at 1.04 GHZ.
FIG. 4C shows an RF Spectra of the 75-150 MHz PLL at 80 MHz.
FIG. 4D shows the phase noise of the RF sources. The 11.44 GHz source was divided by 8 to collect this data.

The architecture described above requires each driving frequency to be a harmonic and phase stable with other frequencies. This was accomplished by using PLLs as the frequency sources. The RF spectra of each PLL is shown (FIGS. 4A, 4B, and 4C respectively). FIG. 4A shows an RF Spectra of the 11-12.5 GHZ PLL at 11.44 GHZ. FIG. 4B shows an RF Spectra of the 1-2 GHz PLL at 1.04 GHz. FIG. 4C shows an RF Spectra of the 75-150 MHz PLL at 80 MHz. The phase noise (FIG. 4D) is collected after each source is amplified. The 11.44 GHz source was divided by 8 to collect this data. It is important to note that each amplifier did not significantly increase the phase noise. These PLLs can output any harmonic frequency within their respective VCO's output range. The RF spectra illustrate the PLLs are operating correctly, and no undesired frequencies are sent to the EOMs. The phase noise of the 80 MHz output is higher than the other PLL outputs, until approximately 100 KHz. A possible explanation is the loop filter is not optimized for the lower PFD frequency the 80 MHz PLL uses.

After characterizing the RF output, the optical modulations the PLL frequencies generate need to be characterized. These modulations create the frequency modes of the EOM comb. Close lying comb teeth can be observed using the heterodyne described earlier in the discussion of FIG. 3. The EOM comb has comb teeth spaced every 80 MHZ, for example the 3rd comb tooth from the seed laser ($v_{YAG}$+240 MHZ) will generate an RF beat with the AOM shifted (260 MHZ) seed laser at 20 MHz. The heterodyne signals allow for the phase noise of a comb tooth to be characterized using a RF spectrum analyzer.

The data collected with the heterodyne measurement is the RF spectrum (FIG. 5A). The phase noise is reported (FIG. 5B), of the EOM comb, the AOM (seed laser), 1.04 GHz modulation, 80 MHz modulation, and the instrument response. The phase noise of the final comb is increased, from 1 kHz to 600 KHz which is not reflected in the observed sources. Direct measurement of the phase noise of the 11.44 GHz modulation was not possible with the spectrum analyzer used. The increase in phase noise can possibly be attributed to the 11.44 GHz and/or optical phase noise.

The RF bandwidth of the spectrum analyzer (1.5 GHZ), detector (2 GHZ), and LNA (3 GHZ) limit the amount of comb teeth that are observable. To measure the higher frequency modulations, the Fabry-Perot was used.

The optical spectra were collected using a home-built scanning Fabry-Perot cavity (pictured in FIG. 3). The Fabry-Perot was designed to qualitatively analyze the intensity of single modulations and collect a spectrum of the EOM comb. This ensures the full bandwidth of the EOM comb can be observed, while having a higher resolution than a grating spectrometer. The finesse (>500 typ.) was verified by measuring the line-width of the Nd:YAG, which has a specified line-width <3 kHz, much lower than the full width at half-maximum (FWHM) of the cavity. In this work, this means that at the largest FSR to capture the full spectral bandwidth, it was not possible to resolve individual comb teeth.

Figures 6A, 6B, 6C:
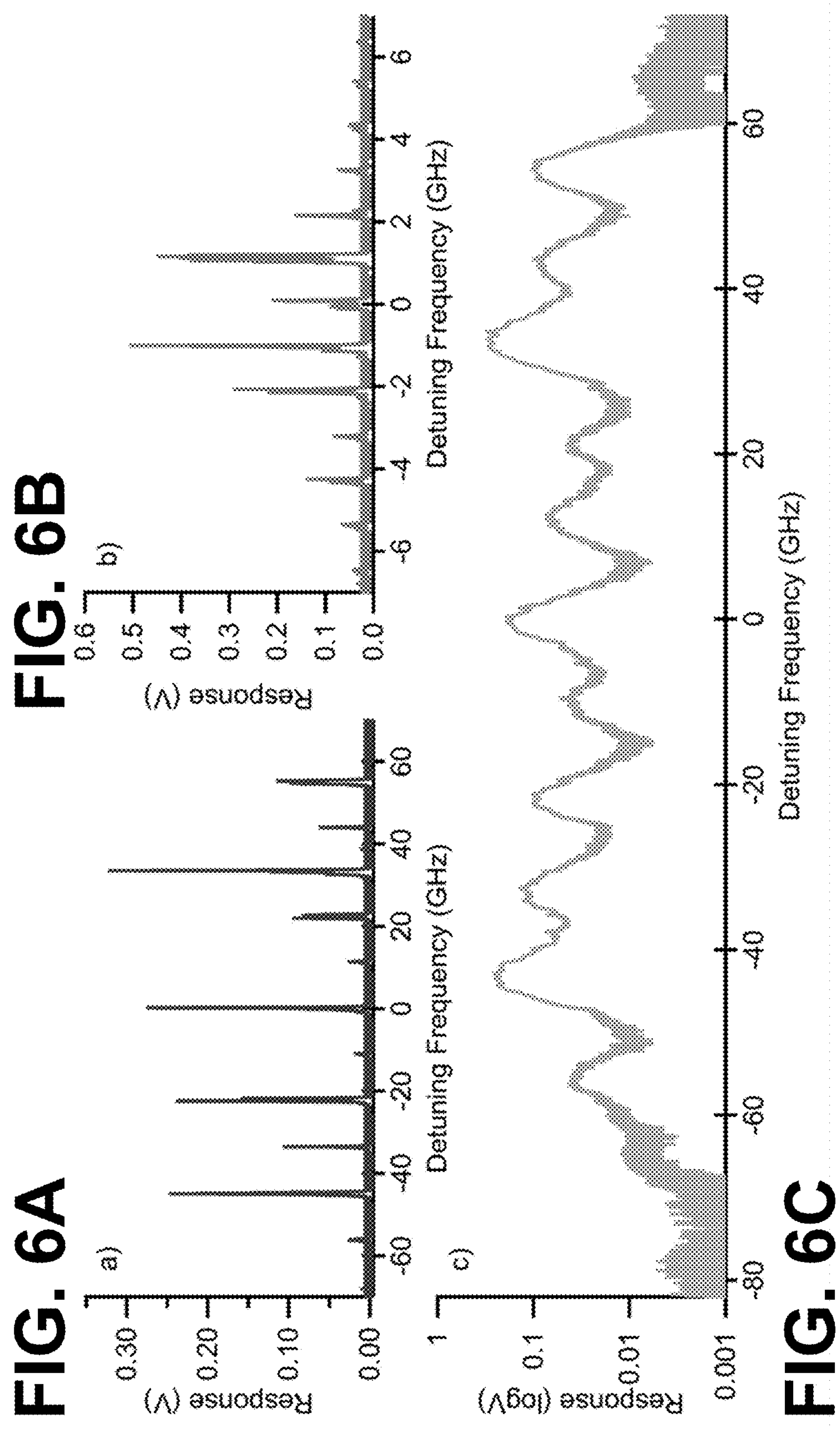
FIGS. 6A-6C show an example of Fabry-Perot Spectra according to various embodiments of the present disclosure.

The scanning Fabry Perot cavity was used to collect full spectra of the EOM comb, 11.44 GHz modulation, and 1.04 GHz modulations. This is to establish that a continuous EOM comb is created, e.g., the lower frequency modulation creates comb teeth spanning the previous modulation. The first modulation at 11.44 GHz creates 5 frequency modes on either side of the fundamental (FIG. 6A), which gives the EOM comb (FIG. 6C) its optical bandwidth. The 1.04 GHz modulation creates 6 modes on either side of the fundamental (FIG. 6B), which will span the 11.44 GHz spaced modes. This is because to span 11.44 GHz you would need to create 11 harmonics to reach 11.44 GHz. However, each mode created by the preceding EOM is modulated by the lower frequency EOM. Therefore, for the 11.44 and 1.04 GHz example, the 1.04 GHz modulation would only need to create 5 side-bands to span the preceding modulation. The 80 MHz modulation creates 17 observable modes in the positive direction, and at least 14 in the negative direction (FIG. 6). The 80 MHz modulation spans the 1.04 GHz modes (14th harmonic) from the preceding EOM. The final spectrum is shown in FIG. 6C, where individual comb teeth are not able to be resolved, however intensity is shown across >120 GHz of bandwidth. This optical bandwidth is much greater than many EOM combs with Megahertz or lower repetition rates before external broadening.

Figures 8A, 8B, 8C:
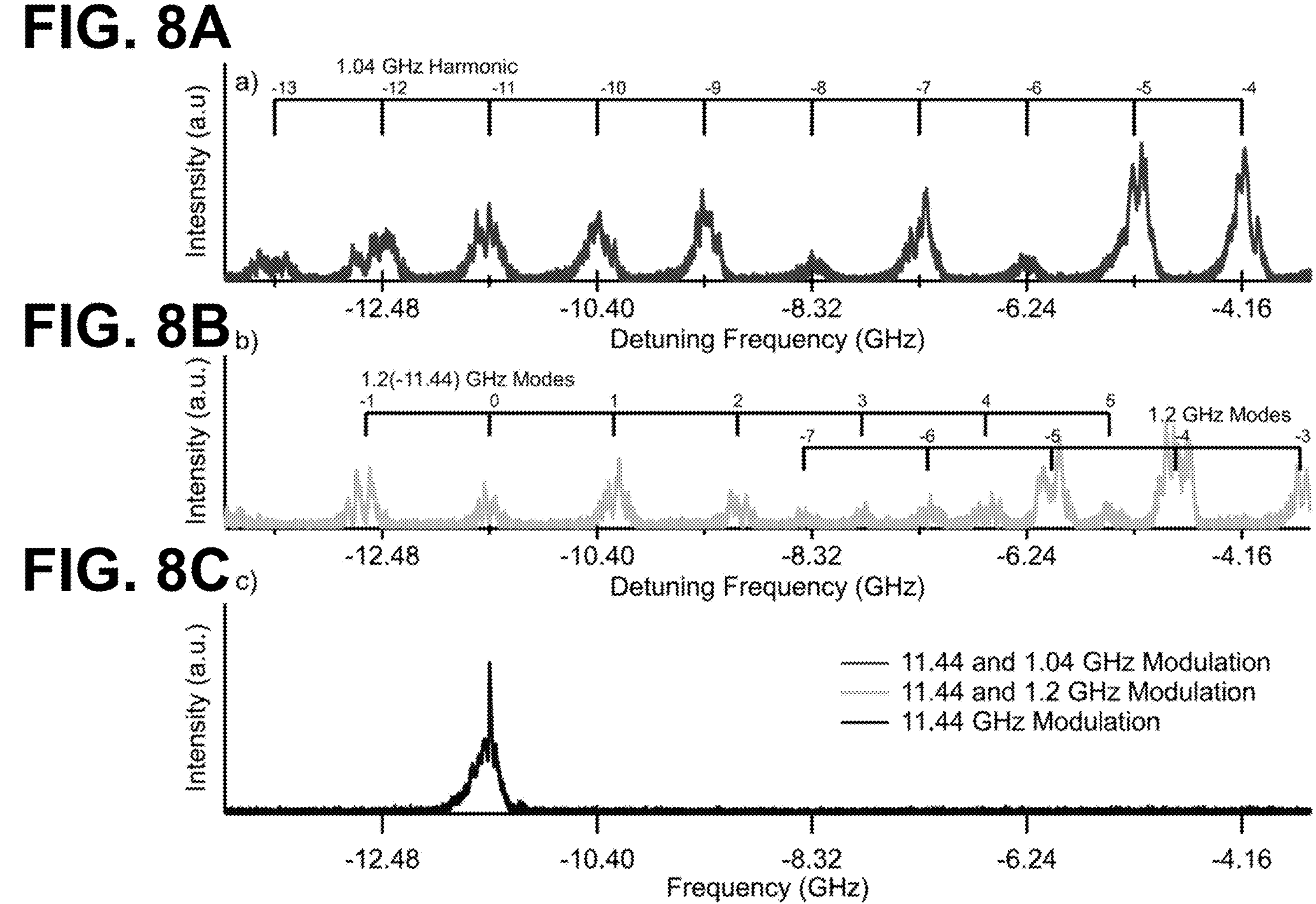
FIGS. 8A-C show examples of Fabry-Perot Spectra according to various embodiments of the present disclosure.

The RF spectra of each PLL confirm that the modulation frequencies are harmonics. Each modulation creates enough modes to span the preceding modulation but the measurements above cannot observe spectral overlap. The spectral overlap was observed using the Fabry-Perot cavity. The seed laser modulated with attenuated 11.44 GHz source (FIG. 8C) and the unattenuated 1.04 GHz source is shown in FIG. 8A. The spectral overlap is shown in mode −7; this harmonic is higher than the adjacent modes. Then first modulation was not changed however the second modulation was 1.2 GHZ (FIG. 8B). The 1.2 GHz modes that are generated from the −11.44 GHz mode are separated from the 1.2 GHz modes generated from the seed laser. The modes generated from these separate sources do not overlap. The line-shape of each frequency mode is from the scanned Fabry-Perot and not the line-shape of the EOM comb.

The EOM modulation does not seem to appreciably affect the relative intensity noise (RIN). There are various frequency spurs in the seed laser RIN and they are not a result of the EOM comb generation. The baseline is not continuous because the data is stitched using different amplifiers, which changed the noise floor. The higher frequency data starting at 1 kilohertz used a LNA and a different spectrum analyzer. Since the RIN is unaffected by the EOM comb generation, lower noise seed laser can be used to reduce the RIN.

The conventional discussion of EOM comb generations uses the Bessel function to describe the intensity of the side-bands generated by a single phase modulation at frequency Ω. This modulation is symmetric about the seed laser (see Eq. 1).

$$E_{out} = A\cos(\omega t - \delta\sin(\Omega t)) = A[J_0(\delta)\cos(\omega t) + J_1(\delta)\cos(\omega+\Omega)t + J_1(\delta)\cos(\omega-\Omega)t + J_2(\delta)\cos(\omega+2\Omega)t + J_2(\delta)\cos(\omega-2\Omega)t + J_3(\delta)\cos(\omega+3\Omega)t + J_3(\delta)\cos(\omega-3\Omega)t + J_4(\delta)\cos(\omega+4\Omega)t + J_4(\delta)\cos(\omega-4\Omega)t + \dots] \quad (1)$$

$E_{out}$ is the electric field of the modulated seed laser. The amplitude of each mode is described by $J_n(\delta)$, the n being the side-band number and 8 is the phase modulation index. The phase modulation index is defined as $$\delta = \left(\frac{1}{2}\right)\pi\left(\frac{V}{V_\pi}\right).$$

This solution does not account for multiple frequencies in a single phase modulator. The driving modulations in this work included higher order harmonics inherent to the frequency sources. The output electric field in this work is described in equation 2. The equation can be extended to have any amount of harmonics.

$$E_{out} = A\cos[\omega t - \delta_1\sin(\Omega t + \phi_1) - \delta_2\sin(2\Omega t + \phi_2) - \delta_3\sin(3\Omega t + \phi_3) - \delta_4\sin(4\Omega t + \phi_4) \dots] \quad (2)$$

Figure 7:
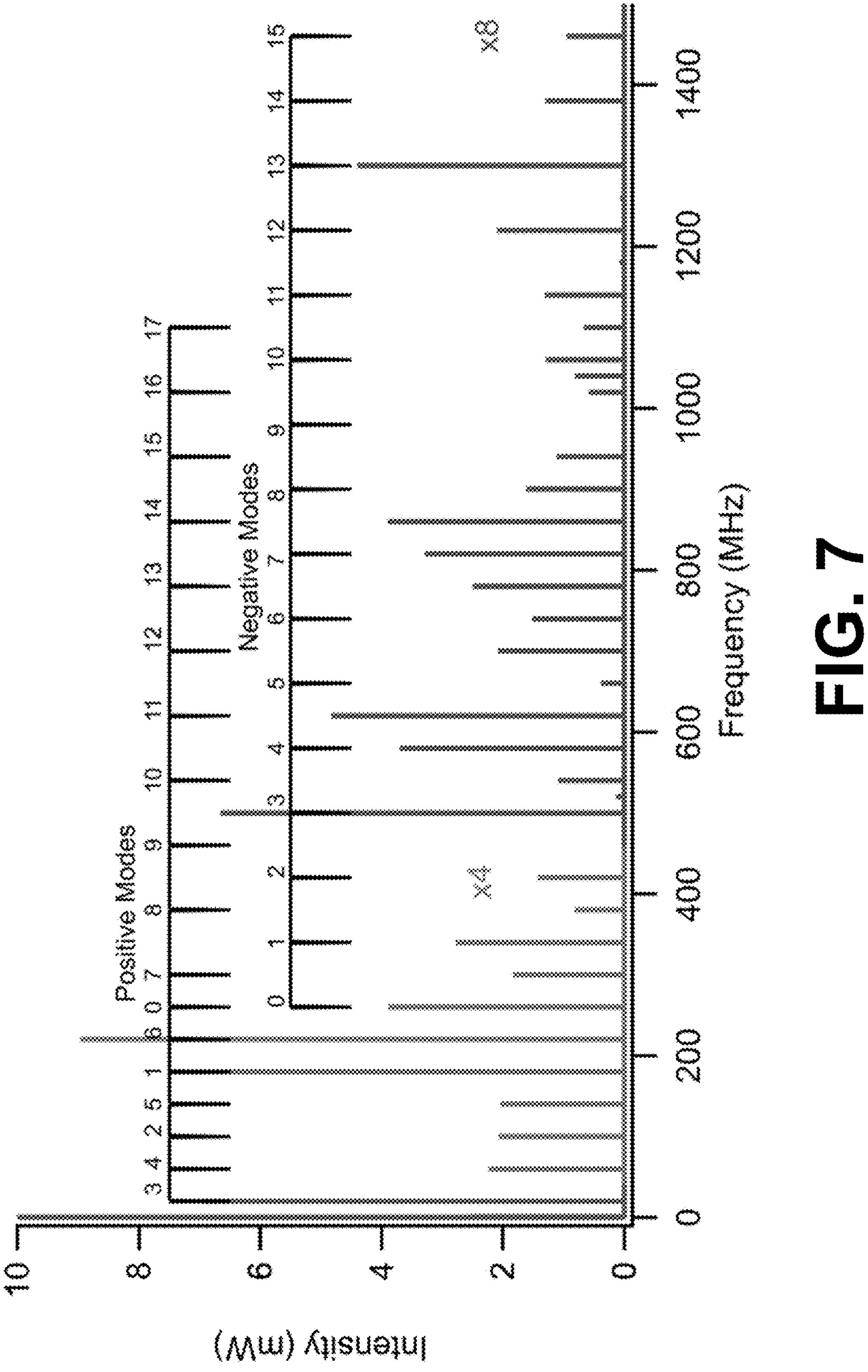
FIG. 7 shows an example of an RF Spectra of the 80 MHz Modulation. Racetracks denote the positive and negative modulations referenced from the seed laser. The seed laser is the $0^{th}$ mode. The first section (0-500) of spectra is multiplied by 4 for clarity. The second section (500-1500) of the spectra is multiplied by 8 for clarity.

The phase modulation index changes with frequency because $V_\pi$ is frequency dependant. The phase of each harmonic is also variable due to phase shifts from RF components. This model of the electric field can output asymmetric side-bands strengths depending on the phase modulation index of each harmonic and the phase of each harmonic. This replicates the asymmetric spectra observed in FIGS. 6A-6B and FIG. 7.

A fully adjustable EOM comb has been demonstrated herein. The novel RF generation containing 3 separate PLLs allows for driving cascaded EOMs at rigorous harmonics of each other creating a broad EOM comb with a MHz repetition rate. The demonstrated advantage of this work is that the repetition rate and exact harmonics chosen are tunable without any change to the hard components. The EOM comb in this paper can have a final repetition rate from 75 MHz to 150 MHz. The comb generation is all-fiber, meaning this method can be applied to any optical regime with a seed laser with acceptable line-width and noise. This EOM comb is uniquely suited for use in spectroscopy due to the long term stability of the frequency sources combined with the stability of a commercial Nd:YAG. Future work could conduct a thorough analysis of harmonics affecting the output side-bands of a single EOM modulation. The qualitative nature of the data from the scanning Fabry-Perot limits the analysis that can be performed.

Therefore, the following is claimed:

1. An electro-optic frequency comb, comprising:

a seed laser directed through a series of phase modulating EOMs, the series of phase modulating EOMS comprising at least:

a first phase-locked loop (PLL) connected in series with a first electro-optic modulator (EOM);

a second PLL connected in series with a second EOM, the second PLL and the first PLL connected in parallel; and a third PLL connected in series with a third EOM, the third PLL connected in parallel with the second PLL and the first PLL.

2. The system of claim 1, wherein the seed laser is matched to a reference frequency.

3. The system of claim 2, wherein each of the first PLL, the second PLL, and the third PLL is connected in series with a respective phase shifter disposed between the reference frequency and the corresponding PLL.

4. The system of claim 2, wherein the reference frequency is generated by a 10 MHZ rubidium clock.

5. The system of claim 1, wherein the seed laser comprises a narrow linewidth laser having a linewidth of less than 1 megahertz (MHz).

6. The system of claim 1, wherein the series of phase modulating EOMS has cascading harmonic frequencies.

7. The system of claim 1, wherein the first EOM comprises an 11-12.5 gigahertz (GHz) EOM, the second EOM comprises a 1-2 GHZ EOM, and the third EOM comprises a 75-150 megahertz (MHz) EOM.

8. The system of claim 1, wherein each of the first PLL, the second PLL, and the third PLL is connected in series with a respective radiofrequency (RF) Amplifier disposed between the PLL and the EOM.

9. The system of claim 1, wherein each of the first PLL, the second PLL, and the third PLL comprises:

a phase detector;

a loop filter connected in series with the phase detector;

a tunable frequency source connected in series with the loop filter; and a frequency divider connected in parallel with the loop filter and the tunable frequency source.

10. The system of claim 9, wherein the frequency divider is selected based at least in part on the reference frequency.

11. An electro-optic modulator (EOM) system, comprising:

a reference frequency source;

a seed laser; and a plurality of phase modulators connected in parallel to the reference frequency source, wherein each phase modulator comprises at least:

a phase shifter connected to the reference frequency source;

a phase-locked loop (PLL) connected in series with the phase shifter; and a radiofrequency amplifier connected in series with the PLL; and a plurality of cascading EOMs connected to the seed laser in series, each EOM of the plurality of cascading EOMs connected to a respective phase modulator.

12. The system of claim 11, wherein each EOM of the plurality of cascading EOMs has a sequentially lower harmonic frequency.

13. The system of claim 11, wherein each EOM of the plurality of cascading EOMs is driven by a respective PLL.

14. The system of claim 11, wherein each PLL comprises:

a phase detector;

a loop filter connected in series with the phase detector;

a voltage controlled oscillator (VCO) connected in series with the loop filter; and a frequency divider connected in parallel with the loop filter and the VCO.

15. The system of claim 14, wherein the frequency divider is selected based at least in part on the reference frequency source.

16. The system of claim 11, wherein the reference frequency source comprises a rubidium clock.

17. The system of claim 11, wherein the seed laser comprises a narrow linewidth laser having a linewidth of less than 1 megahertz (MHz).

18. A method of generating an electro-optic frequency comb (EOM comb) comprising:

directing a seed laser through a series of cascading electro-optic modulators (EOMs);

driving each EOM of the series of cascading EOMs with a respective phase-locked loop (PLL), each EOM having a sequentially lower harmonic frequency; and stabilizing each of the PLLs with a reference frequency.

19. The method of claim 18, wherein driving each EOM of the series of cascading EOMs with a respective PLL further comprises:

controlling a relative phase between the reference frequency and the PLL with a respective phase shifter; and generating a phase stable single frequency with the respective PLL.

20. The method of claim 18, wherein each PLL comprises:

a phase detector;

a loop filter connected in series with the phase detector;

a voltage controlled oscillator (VCO) connected in series with the loop filter; and a frequency divider connected in parallel with the loop filter and the VCO.

* * * * *